United States Patent
Hayden et al.

[11] Patent Number: 5,963,426
[45] Date of Patent: *Oct. 5, 1999

[54] ELECTRONIC MICROPACKAGING ASSEMBLY AND ITS FABRICATION

[75] Inventors: Warren W. Hayden, Torrance; Ronald L. Williams, Fallbrook, both of Calif.

[73] Assignee: Raytheon Company, Lexington, Mass.

[*] Notice: This patent is subject to a terminal disclaimer.

[21] Appl. No.: 08/858,640

[22] Filed: May 19, 1997

[51] Int. Cl.$^6$ .................................................. H05K 7/20
[52] U.S. Cl. ........................ 361/704; 361/715; 361/790; 361/796; 361/803
[58] Field of Search .................................... 361/690, 704, 361/707, 715–716, 719, 721, 733, 735, 744, 785, 789, 790, 796, 803; 439/66, 91, 485

[56] References Cited

U.S. PATENT DOCUMENTS

| | | |
|---|---|---|
| 4,453,795 | 6/1984 | Moulin . |
| 4,764,846 | 8/1988 | Go ............................................. 361/716 |
| 5,197,184 | 3/1993 | Crumly et al. . |
| 5,307,561 | 5/1994 | Feigenbaum et al. . |

OTHER PUBLICATIONS

Audi "Colling and Minimizing Temperature Gradient In Stacked Modules" IBM Tech Disc Bulletin, vol. 19, No. 2, Jul. 1976, p. 414. 361/707.

Primary Examiner—Gregory Thompson
Attorney, Agent, or Firm—Colin M. Raufer; Leonard A. Alkov; Glenn H. Lenzen, Jr.

[57] ABSTRACT

A multilayer microelectronic module assembly has at least two planar module structures, in the form of boards lying parallel to each other and which must be electrically interconnected. Each planar module structure has electronic circuitry thereon and electrical interconnect locations in registry with corresponding electrical interconnect locations on the adjacent planar module structure. The electrical interconnections are accomplished by closely spaced direct electrical interconnectors extending between the respective electrical interconnection locations on the adjacent planar module structures. Each module assembly is preferably affixed to a support. Multiple supports are arranged parallel to each other and electrically interconnected by similar direct electrical interconnectors. By accomplishing the electrical interconnections using direct electrical interconnectors rather than a conventional backplane, there is room at the periphery of the planar module structures for attachment to a thermally conductive heat sink, which efficiently removes heat generated by the electronic circuitry on the planar module structures.

22 Claims, 5 Drawing Sheets

ELECTRONIC MICROPACKAGING ASSEMBLY AND ITS FABRICATION

BACKGROUND OF THE INVENTION

This invention relates to microelectronic devices, and, more particularly, to a packaging structure for multilayered microelectronic devices.

A major challenge in the design of complex electronic devices such as specialized computers and controllers is to provide ever-more-powerful and more-complex electronic circuitry in small, light packages. Great advances have been made in microelectronic fabrication that permit large numbers of circuit elements to be fabricated onto individual chips, which are in turn attached to a circuit board.

In one common architecture, the circuit elements are placed onto a number of circuit boards, due to reasons of manufacturing efficiency, electronic function and requirements, size and complexity, and ease and cost of replacement in the event of a failure of one of the electronic components. The circuit boards are disposed in parallel to each other and affixed to another board commonly termed a backplane or backplane board. The backplane has a pattern of thin metallic leads termed traces thereon to provide electrically connective paths between the adjacent circuit boards. Such a packaging architecture is found in most desk-top computers, for example.

For many applications, this architecture is fully satisfactory. In others, however, the long electrical path lengths between circuit elements on adjacent circuit boards, through the backplane board, result in slower-than-desired operating speeds. The long path lengths also produce higher power dissipation during high-speed operation.

Additionally, the electronic components on the circuit boards generate heat during operation, which must be conducted away to avoid overheating. The removal of heat may be the limiting consideration in reducing the size and weight of the electronic device, especially in those cases where the electronic device utilizes a good deal of power or processes high-frequency signals. Most commonly, the heat may be dissipated by forcing air to flow between the circuit boards to absorb the heat, and thereafter carry the heat away through a ventilation grill. In some situations this approach is not feasible, as for example where the entire electronic device is hermetically sealed within an enclosure. In that case and in others for reasons of cooling efficiency, the heat is conducted away by metallic conductors or heat pipes that extend to the circuit boards at one end and a radiator or other heat sink at the other. The removal of heat by such known approaches is operable, but adds greatly to the size and weight of the electronic device.

There is a need for an improved approach for the architecture and structure of microelectronic packaging applications to overcome these problems. The present invention fulfills this need, and further provides related advantages.

SUMMARY OF THE INVENTION

The present invention provides a microelectronic assembly and an approach to its fabrication. The microelectronic assembly is highly modular, permitting easy assembly and later, if necessary, disassembly and replacement of elements. Electronic path lengths between neighboring planar elements are much shorter than in prior approaches, and in particular shorter than possible using a conventional backplane technique. Cooling is also improved, due to the use of heat sinks in close proximity to the heat-producing components. The architecture permits electronic devices to be built up using modular assemblies.

In accordance with the invention, a microelectronic assembly comprises a first module assembly, which includes a first planar module structure having a first-module edge and comprising first electronic circuitry, and a plurality of first-module electrical interconnect locations on the first electronic circuitry. The first module assembly further includes a second planar module structure parallel to but spaced apart from the first planar module structure by a distance of at least about 0.050 inches and having a second-module edge. The second planar module structure comprises second electronic circuitry, and a plurality of second-module electrical interconnect locations on the second electronic circuitry. The second-module electrical interconnect locations are in registration with the first-module electrical interconnect locations. A plurality of direct electrical interconnectors respectively extend between the plurality of first-module electrical interconnect locations and the plurality of second-module electrical interconnect locations, accomplishing the module-to-module interconnections directly and without the use of a backplane board. Instead of a backplane, there is a thermally conductive heat sink to which the first-module edge of the first planar module structure and the second-module edge of the second planar module structure are in direct thermal contact. Because the direct electrical interconnectors are not located at the peripheries of the module assemblies, a large part—up to all—of the periphery of each module assembly is available to be contacted directly to the heat sink(s).

Each of the direct electrical interconnectors preferably comprises a metallic electrical conductor, such as a wire, extending between one of the first-module electrical interconnect locations and a respective one of the second-module electrical interconnection locations. The electrical conductor is supported along its length by a support structure such as a base or a plate, unlike approaches such as jumpers extending between adjacent boards. An important advantage of this interconnect approach is that the electrical conductor may be made as long as necessary to accommodate the requirements for spacing between the first planar module and the second planar module, which may vary according to individual circuit requirements, yet remains substantially straight and may be densely packed closely together in a side-by-side fashion. No heavy, space-consuming additional insulation is required between the electrical conductors with this approach. A plurality of the direct electrical interconnectors are conveniently assembled together as a module interconnector unit, for efficiently accomplishing the interconnection during assembly of the module assembly. The module assembly may be hermetically sealed with the direct electrical interconnectors inside the module assembly.

Each module assembly is preferably affixed to a support, such as a planar frame. An electronic device is assembled from a number of the supports, with their module assemblies arranged parallel to each other. The approach of direct electrical interconnectors is used to electrically connect the adjacent module assemblies. The common heat sink is used for all of the module assemblies in the parallel supports.

The use of the present approach provides numerous important benefits. The electrical path lengths between modules and between supports is as short as possible, because the electrical signals pass in substantially a straight line rather than through the circuitous route of a backplane. Heat removal is facilitated by the heat sink, which is positioned close to each of the heat sources. The entire periphery of the module assemblies is available for contacting to the heat sinks, inasmuch as no edge electrical connectors are required. No separate heat conductors are required. Separation of various subsystems into modules and between different supports minimizes possible interference due to electrical signals, heat production, and the like. The interconnect approach provides good accommodation of varying spacing requirements within the module assemblies and also between the supports. The unit is readily assembled and, where necessary, disassembled for repair and/or replacement of components.

The inventors have designed the packaging and interconnects for the electronics of an infrared space telescope using the approach of the invention. According to this design, the volume and weight of the electronics package according to the present approach is about ⅛ of that using the conventional approach, important considerations for electronics which must be launched into space.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 8(a)–8(c) illustrate a second embodiment of the module interconnect unit, wherein FIG. 8(a) is an end view at an intermediate stage of manufacture, FIG. 8(b) is a sectional view during manufacture, taken along lines 8(b)–8(b) of FIG. 8(a), and FIG. 8(c) is an elevational view of the completed interconnect unit.

DETAILED DESCRIPTION OF THE INVENTION

Figure 1:
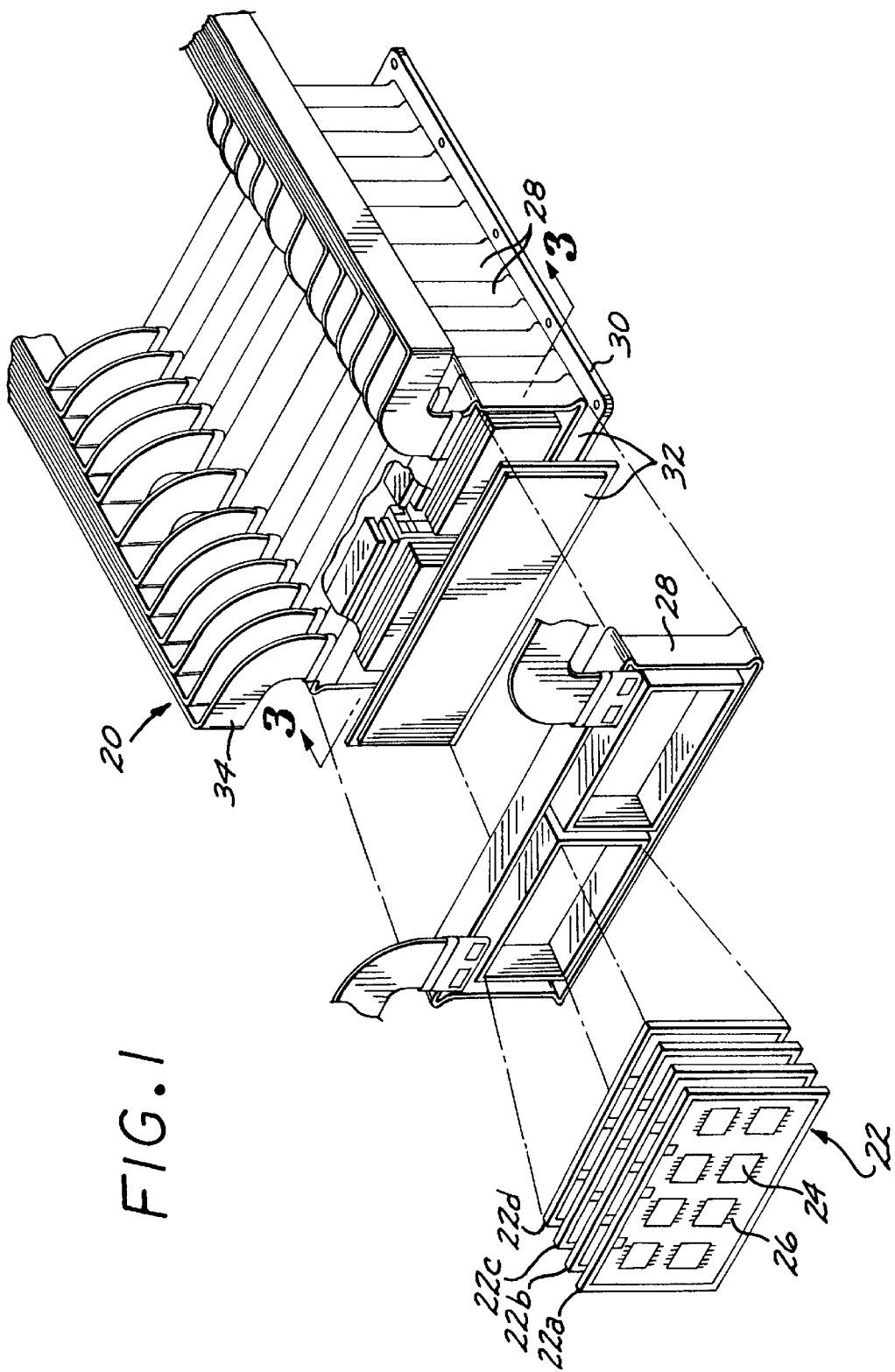
FIG. 1 is a schematic perspective sequential assembly view of a microelectronic assembly according to the invention.

FIG. 1 illustrates a microelectronic assembly 20 according to the invention, in a partially exploded form to illustrate the manner of assembly and interrelation of the components. The assembly 20 includes four module assemblies 22, indicated as 22a, 22b, 22c, and 22d. In each of the module assemblies 22, there is electronic circuitry 24 with a plurality of electrical interconnect locations 26 on the electronic circuitry 24. Any operable electronic circuitry 24 may be used, but typically at least one of the electronic circuits is a microprocessor or a portion thereof. The present invention is not concerned with the details of the nature of the electronic circuitry 24, but instead is concerned with its assembly, interconnection, and packaging as discussed in detail subsequently.

Each of the module assemblies 22 is affixed to a support 28. In the preferred case, the support 28 is an aluminum alloy frame. Each support 28 is affixed to a thermally conductive heat sink 30. The heat sink 30 is preferably one wall of an enclosure 32 (only the bottom and front of which are shown) for the microelectronic assembly 20. The heat sink 30 may also be a separate component, apart from the enclosure. External leads 34 extend to the support 28 and thence to the module assemblies 22.

Figure 2:
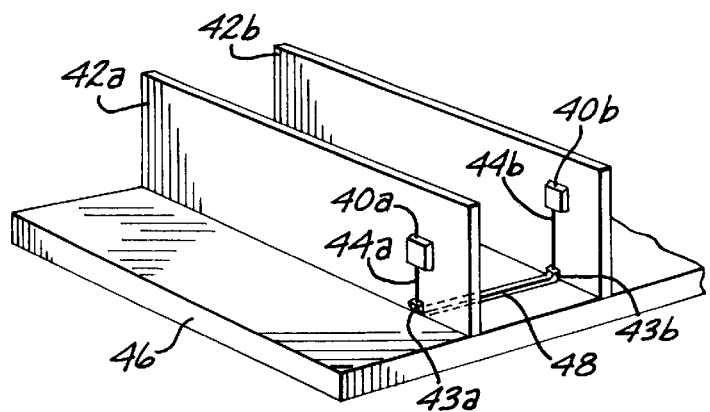
FIG. 2 is a perspective view of a conventional backplane-type microelectronic assembly.

This architecture is to be contrasted with that conventionally used, as shown in FIG. 2. In this prior approach, the circuit elements (e.g., elements 40a and 40b) are mounted on electrically nonconductive boards 42a and 42b. The circuit elements 40a and 40b are in electrical communication with connectors 43a and 43b along the bottom edge of the respective boards 42a and 42b via electrically conductive traces 44a and 44b. The boards 42a and 42b are affixed to a backplane board 46. The backplane board 46 is made of an electrical insulator material, so that it cannot serve as an effective heat sink, and has electrically conductive traces 48 thereon extending between the connectors 43a and 43b. To electrically communicate between the circuit elements 40a and 40b, signals pass through the traces 44a and 44b, as well as the trace 48, a rather circuitous and overly lengthy path. Cooling of the circuit elements 40a and 40b is accomplished by natural or forced convection of air between the boards 42a and 42b, or by conductive metallic conductors (not shown) or the like.

Figure 3:
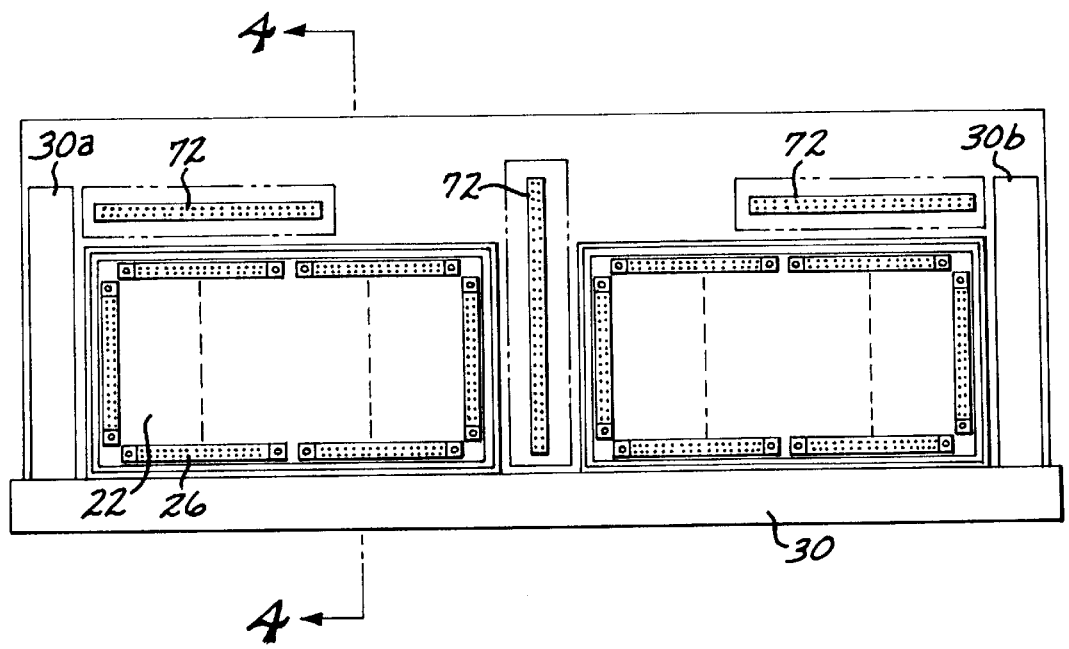
FIG. 3 is a schematic front elevational view of the microelectronic assembly of FIG. 1, taken along line 3—3.
Figure 4:
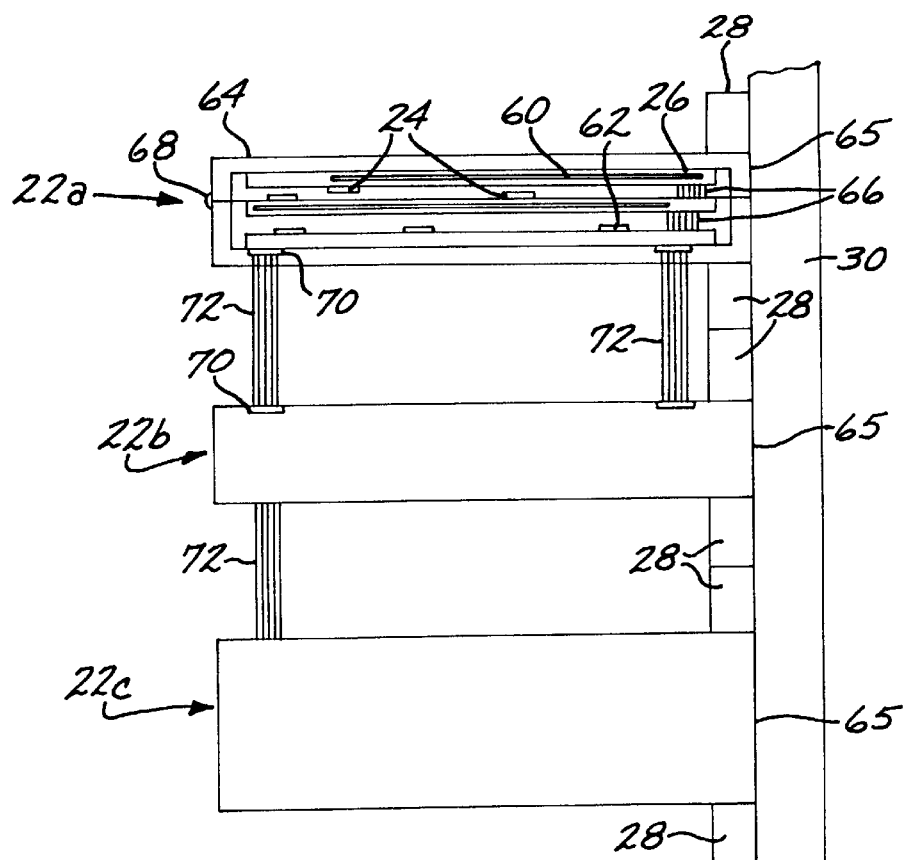
FIG. 4 is a schematic sectional view of the microelectronic assembly of FIG. 3, taken along line 4—4.

FIGS. 3 and 4 illustrate further details of the assembly 20 according to the invention. The module assembly 22 has electronic circuitry that includes flat circuit elements 60 such as chips, multilayer chip stacks with at least two sublayers, integrated circuits, and the like. The assembly 22 also typically has three-dimensional circuit elements 62 such as capacitors, resistors, and other passive components, mounted to the flat circuit elements 60. Because of the three-dimensional circuit elements 62, the flat circuit elements 60 must be spaced apart, by an amount that is at least 0.050 inches, and typically about 0.1–0.3 inches. The circuit elements 60 and 62 are desirably enclosed in a housing 64, which is preferably sealed so as to be hermetic, as with a glass seal 68. The housing may be made of a high-thermal-conductivity ceramic such as alumina. As illustrated, the housing 64 is affixed to the frame 28, which holds an edge 65 of the housing 64 in direct thermal contact with the heat sink 30 so as to remove heat from the circuit elements 60 and 62 most efficiently. Where appropriate, additional side heat sinks 30a and 30b may also be provided as part of the enclosure or as separate elements, to remove heat even more effectively. The heat sinks 30 are preferably made of copper.

Interconnection between the flat circuit elements 60 is usually required in most complex electronic systems. Due to the required spacing between the flat circuit elements, the conventional approach would be to use a variation of the backplane technique illustrated in FIG. 2.

According to the present approach, the electrical interconnect locations 26 are provided on the flat circuit elements, with the interconnect locations for opposing pairs of flat circuit elements 60 positioned in registry (i.e., directly opposing each other in a face-to-face, but spaced-apart, relation). A plurality of circuit element direct electrical interconnectors 66 extend between the facing electrical interconnect locations 26 on the facing flat circuit elements 60.

Similarly, it is usually necessary to electrically connect the neighboring module assemblies, such as 22a with 22b, and 22b with 22c, which may be separated by 0.5 inch or more for reasons such as electrical isolation. To this end, external interconnect locations 70 are provided at the appropriate flat circuit elements 60, with the interconnect locations for opposing pairs of flat circuit elements 60, in neighboring supports 28, positioned in registry (i.e., directly opposing each other). A plurality of support direct electrical interconnectors 72 extend between the interconnect locations 70 on the facing flat circuit elements.

The structure of the direct electrical interconnectors 66 and 72 will be discussed in detail subsequently. However, from FIG. 4, several important features are apparent. The direct electrical interconnectors 66 and 72 provide direct, straight-line connections between facing circuit elements. These straight-line connections permit faster electrical communication, with less capacitive interference, than possible with the circuitous conventional interconnection approach of FIG. 2. The direct electrical interconnectors 66 and 72 may be made of any length selected to accommodate the separation distance of the facing elements being connected. In an application studied by the inventors, the circuit element direct electrical interconnectors 66 were about 0.1 to about 0.3 inches long. The support direct electrical interconnectors 72 were about 1 inch long. Although the length varies as needed, the same manufacturing techniques are used for all practical lengths under consideration. The ability to establish the lengths of the direct electrical interconnectors 66 and 72 allows the use of various thicknesses and spacings of the connected elements. For example, because the heights of the three-dimensional circuit elements 62 may vary widely, the spacings between the flat circuit elements 60 within any housing 64 may also vary. Also, the thicknesses of the module assemblies, such as 22b and 22c, may vary due to different numbers of layers of circuit elements in the various module assemblies and other reasons. The present approach of using direct electrical interconnectors 66 and 72 readily accommodates all such variations in dimensions.

High-density electrical interconnects are known for use in situations where the spacing of the structures to be interconnected is small. For example, "bump" interconnects have been known in the art, see, for example, U.S. Pat. Nos. 5,197,184 and 5,307,561, whose disclosures are incorporated by reference. Such bump interconnects are generally raised features on the surfaces of a flat circuit element. They provide an interconnect capability in the direction perpendicular to the circuit element which is limited to spacings of about 0.005 inch or less. The direct electrical interconnectors of the present invention provide interconnection between flat circuit elements that are spaced by much greater distances, at least about 0.050 inches and up to 1.0 inches or more. Spacings greater than about 0.050 inches are required to accommodate components such as the elements 62.

Figure 5:
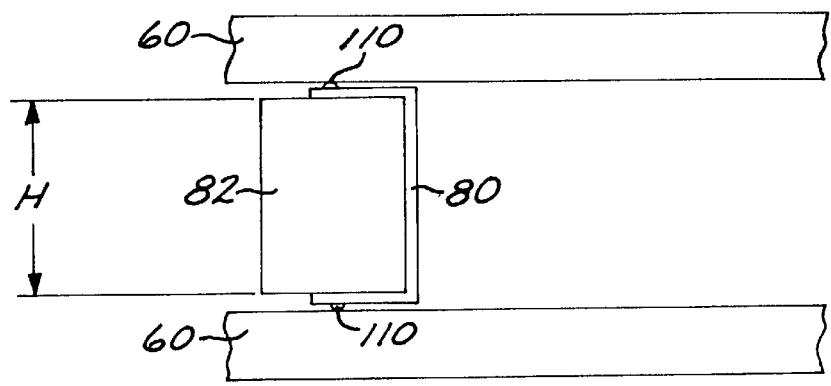
FIG. 5 is a schematic view of the preferred structure of a first embodiment of a module interconnector unit.

FIG. 5 illustrates one preferred approach to the structure and preparation of the direct electrical interconnectors 66 and 72. A length of a springy electrical conductor, shown as the preferred wire 80, is bent into a "C" shape over a base 82 of a suitable insulator material, such as an elastomer or a ceramic, which serves as its support structure. The base 82 is preferably in the form of a block of the insulator material that supports the length of the electrical conductor. The height H of the base 82 is selected to allow the electrically conductive wire 80 to extend between the circuit elements 60 that are to be interconnected. The wire 80 is preferably gold-plated copper-beryllium wire of any suitable diameter. In a typical application, as illustrated in FIG. 3, there are hundreds of interconnections to be made. The required number of the electrical conductors, such as the wires 80, may be supported on the one base 82. The plurality of electrical conductors 80 may be densely packed on the base in a side-by-side relation, and spaced apart by no more than about 0.050 inches, preferably spaced apart by no more than about 0.025 inches. These small spacings are required to accommodate the large numbers of interconnections to be made within the space available along the respective peripheries.

Figure 6:
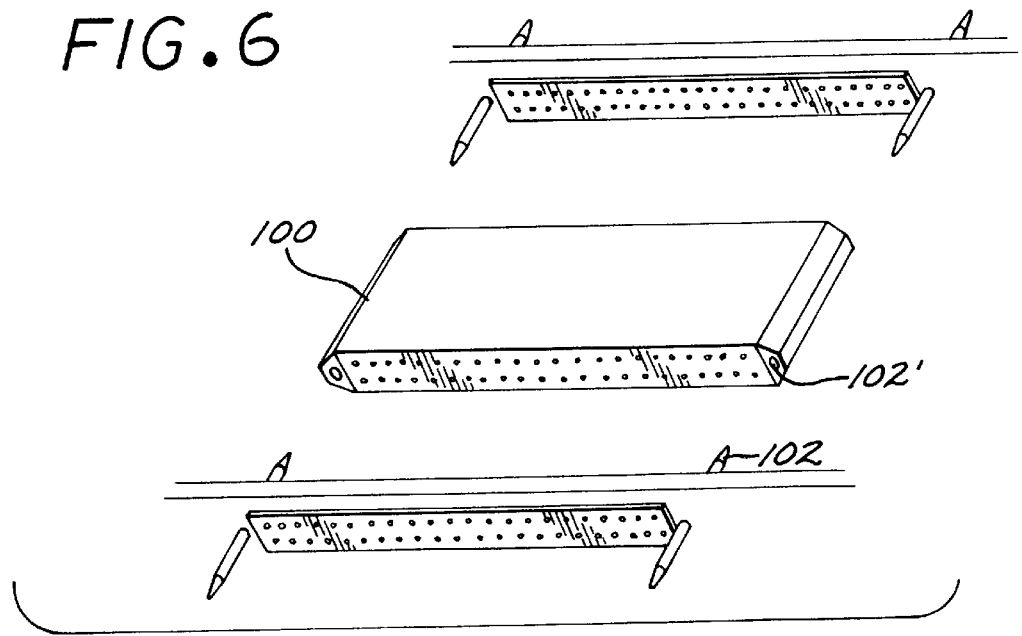
FIG. 6 is a perspective view of a module interconnect unit.

With this preferred approach and others that may be suitable for specific applications, the direct electrical interconnectors 66 or 72, having the structure discussed above, may be supplied as a unitary interconnect unit 100, as seen in FIG. 6. (If the interconnect unit incorporates the interconnectors 66, it is termed a "module interconnect unit"; if the interconnect unit incorporates the interconnectors 72, it is termed a "support interconnect unit".) In such an interconnect unit 100, a plurality of the electrical conductors, here shown as the wires 80, are supported on a single base of the insulating material. In one design under development by the inventors wherein the modules are spaced apart by about 0.1 inches and corresponding generally to the configuration shown in FIG. 3, one interconnect unit has 1260 individual electrical conductors 80 therein, and another interconnect unit has 900 individual electrical conductors 80 therein. Locating pins 102 are provided on the circuit elements to be connected, permitting the interconnect unit to be readily positioned with corresponding recesses 102' that receive the locating pins 102 therein.

Figure 7:
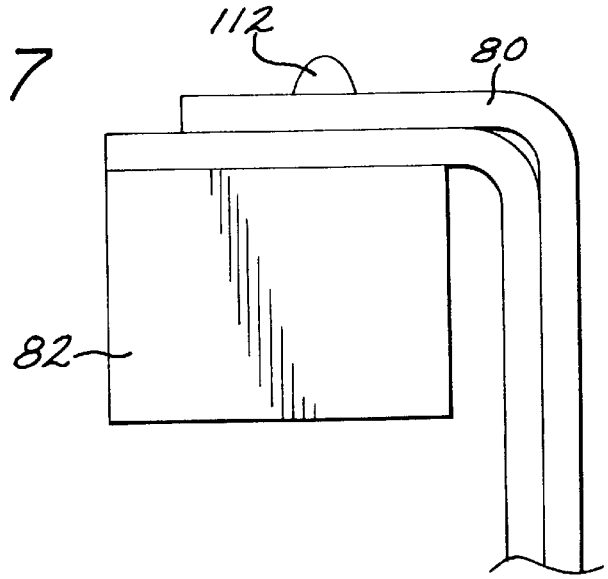
FIG. 7 is a schematic elevational view of an interface connector.

In the approach of FIGS. 5–6 and others, it is necessary to provide a contact 110 (see FIG. 5) between the direct electrical interconnectors 66 or 72, and the circuit element 60. A preferred approach to the fabrication of such contacts 110 is shown in FIG. 7. In FIG. 7, a raised contact 112 of a material such as gold is deposited upon the top side of the electrical conductor 80, so that it makes electrical contact with the interconnect locations on the circuit elements. The height of such a contact 110 or 112 is limited to about 0.005 inches, and it therefore could not be employed to extend the entire distance H in FIG. 5.

Figure 8A:
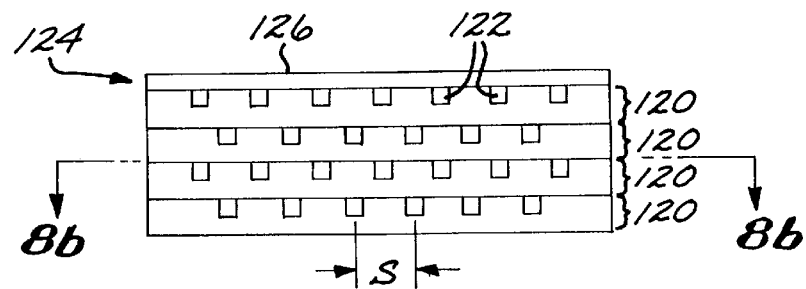
Figures 8B, 8C:
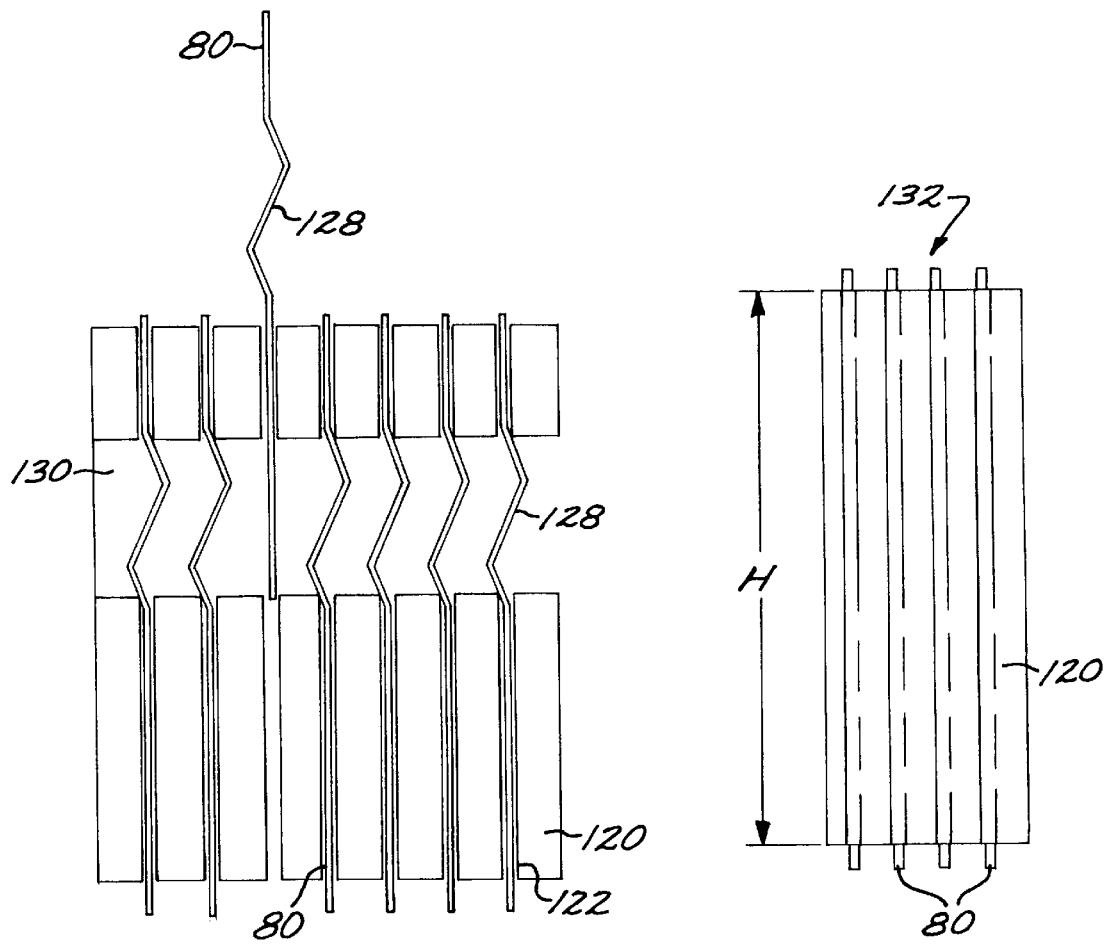

FIGS. 8(a)–8(c) illustrate another approach to the structure and manufacturing of the interconnect unit. As shown in FIG. 8(a), a number of flat plates 120 are prepared of an electrically nonconducting material, such as a ceramic or an electrically insulating organic resin material. A plurality of parallel grooves 122 are formed into each plate 120. The grooves may be formed in any operable manner. For example, the plates 120 may be formed as flat plates, and the grooves machined, pressed, or otherwise formed into the surfaces of the plates. Alternatively, the plates may be manufactured with the grooves in place, which would typically be the approach for ceramic plates 120. The center-to-center spacing S of the grooves determines the spacing of the electrical conductors in the completed interconnect unit. The values of S may vary on any one of the flat plates 120, and the values of S may vary from plate to plate. Typically, S is no more than 0.050 inch, and more preferably no more than about 0.025 inch, to accommodate the large number of electrical conductors required. The plates 120 are laminated together in a stack 124, and an end cover 126 is laminated into place on the last of the plates 120. As illustrated, the number of grooves may be quite large in any one plate, and as many plates may be provided and laminated together as necessary. Large numbers of interconnects may be formed with this approach.

The electrically conductive wires 80 are placed into the grooves 122. The plates 120 and grooves 122 thereby act as the support structure for the electrical conductors over the entire length of the electrical conductors.

The electrical conductors 80 may be laid into the grooves 122 prior to lamination. Alternatively, and as shown in FIG. 8(*b*), the electrical conductors 80 may be inserted lengthwise into the grooves 122 after lamination has been completed. FIG. 8(*b*) shows six wires 80 already in place within their respective grooves 122, and a seventh being inserted lengthwise into its groove 122. Each of the electrical conductors 80 may intentionally be bent slightly at an intermediate location 128, with a corresponding gap 130 provided in the material of the grooves 122 and the plate 120. The bend 128 is retained within the gap 130 after insertion, but later the electrical conductor may be removed with a pull parallel to the length of the wire. The bend 128 also provides a spring effect to aid in accommodating tolerances and in making the end electrical interconnections.

FIG. 8(*c*) illustrates a completed interconnect unit 132 made by this approach. The height H of the interconnect unit 132 may be whatever value is required to extend between the adjacent modules or supports that are to be interconnected. The value of H is established in the dimensions of the flat plates 120, which are dimensioned to reach between the adjacent modules or supports but leave a short length of each electrical conductor 80 protruding from each end of each groove to allow interconnection. The electrical conductors 80 are fully insulated from each other and supported along their lengths so that they do not buckle.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microelectronic assembly, comprising
    a first module assembly, including
        a first planar module structure having a first-module edge and comprising
            first electronic circuitry, and
            a plurality of first-module electrical interconnect locations on the first electronic circuitry,
        a second planar module structure parallel to but spaced apart from the first planar module structure by a distance of at least about 0.050 inches and having a second-module edge, the second planar module structure comprising
            second electronic circuitry, and
            a plurality of second-module electrical interconnect locations on the second electronic circuitry, the second-module electrical interconnect locations being in registration with the first-module electrical interconnect locations,
        a plurality of module direct electrical interconnectors respectively extending between the plurality of first-module electrical interconnect locations and the plurality of second-module electrical interconnect locations; and
    a thermally conductive heat sink with which the first-module edge of the first planar module structure and the second-module edge of the second planar module structure are in direct thermal contact, wherein the plurality of module direct electrical interconnectors do not contact and do not pass through the heat sink.

2. The microelectronic assembly of claim 1, wherein there is no backplane electrical interconnect extending between the first planar module structure and the second planar module structure.

3. The microelectronic assembly of claim 1, wherein the first planar module structure and the second planar module structure are spaced apart by a distance of from about 0.1 inch to about 0.3 inch.

4. The microelectronic assembly of claim 1, wherein each of the first-module electrical interconnect locations has an interconnect spacing from an adjacent first-module electrical interconnect location of no more than about 0.050 inches.

5. The microelectronic assembly of claim 1, wherein each of the first-module electrical interconnect locations has an interconnect spacing from an adjacent first-module electrical interconnect location of no more than about 0.025 inches.

6. The microelectronic assembly of claim 1, wherein each module direct electrical interconnector comprises
    a metallic electrical conductor extending between one of the first-module electrical interconnect locations and a respective one of the second-module electrical interconnect locations.

7. The microelectronic assembly of claim 6, wherein the electrical conductor is supported upon a base of an electrical insulator material.

8. The microelectronic assembly of claim 6, wherein the electrical conductor is supported upon a plate of an electrical insulator material.

9. The microelectronic assembly of claim 1, wherein the microelectronic assembly comprises
    a support structure, and
    the plurality of the module direct electrical interconnectors supported on the support structure.

10. The microelectronic assembly of claim 1, wherein at least a portion of the plurality of the direct electrical interconnectors are assembled together as a module interconnect unit.

11. The microelectronic assembly of claim 1, further including
    a hermetic seal extending around a periphery of the module assembly, such that the first planar module structure, the second planar module structure, and the direct electrical interconnectors lie within the interior of the hermetic seal, and the heat sink lies outside the hermetic seal.

12. The microelectronic assembly of claim 1, further including a first support to which the module assembly is affixed.

13. The microelectronic assembly of claim 12, further including
    a second module assembly having a structure like that of the first module assembly,
    a second support to which the second module assembly is affixed, the second support being parallel to but spaced apart from the first support, and
    a plurality of direct electrical interconnectors respectively extending between the first support structure and the second support.

14. The microelectronic assembly of claim 1, wherein at least one of the first electronic circuitry and the second electronic circuitry comprises a microprocessor.

15. A microelectronic assembly, comprising
    a first module assembly and a second module assembly, each module assembly including
        a first planar module structure having a first-module edge and comprising
            first electronic circuitry, and
            a plurality of first-module electrical interconnect locations on the first electronic circuitry,
        a second planar module structure parallel to but spaced apart from the first planar module structure and having a second-module edge, the second planar module structure comprising second electronic circuitry, and a plurality of second-module electrical interconnect locations on the second electronic circuitry, the second-module electrical interconnect locations being in registration with the first-module electrical interconnect locations, a plurality of module direct electrical interconnectors respectively extending between the plurality of first-module electrical interconnect locations and the plurality of second-module electrical interconnect locations;

a first support to which the first module assembly is affixed;

a second support to which the second module assembly is affixed, such that the first module assembly and the second module assembly are separated by a support distance;

a plurality of support direct electrical interconnectors respectively extending between the first support and the second support; and a thermally conductive heat sink to which the first-module edge of the first planar module structure and the second-module edge of the second planar module structure of each module assembly are in direct thermal contact.

16. The microelectronic assembly of claim 15, wherein the support distance is at least about 0.5 inches.

17. The microelectronic assembly of claim 15, wherein each support direct electrical interconnector comprises a metallic electrical conductor extending between the first support and the second support.

18. The microelectronic assembly of claim 15, wherein each support direct electrical interconnector comprises a metallic, electrical conductor extending between one of the first-module electrical interconnect locations and a respective one of the second-module electrical interconnect locations.

19. The microelectronic assembly of claim 15, wherein the microelectronic assembly comprises a support structure, and the plurality of the support direct electrical interconnectors supported on the support structure.

20. The microelectronic assembly of claim 19, wherein at least a portion of the plurality of the support direct electrical interconnectors are assembled together as a support interconnect unit having a single support and a plurality of electrical conductors supported on the single support.

21. The microelectronic assembly of claim 1, wherein the heat sink comprises copper.

22. The microelectronic assembly of claim 15, wherein the heat sink comprises copper.

* * * * *

UNITED STATES PATENT AND TRADEMARK OFFICE
CERTIFICATE OF CORRECTION

PATENT NO : 5,963,426

DATED : October 5, 1999

INVENTOR(S) : Warren W. Hayden

It is certified that error appears in the above-identified patent and that said Letters Patent is hereby corrected as shown below:

On the title page: Column 1, line 3, please insert the following paragraph:

--This invention was made with Government support under Contract No. DASG60-90-C-0135 awarded by the Department of the Army. The Government has certain rights in this invention.--

Signed and Sealed this

Twenty-third Day of May, 2000

Attest:

Q. TODD DICKINSON

Attesting Officer      Director of Patents and Trademarks